United States Patent
Oddou et al.

(10) Patent No.: US 7,686,228 B2
(45) Date of Patent: Mar. 30, 2010

(54) SMART CARD WITH EXTENDED SURFACE MODULE

(75) Inventors: Laurent Oddou, La Ciotat (FR); Stéphane Ottobon, La Ciotat (FR)

(73) Assignee: Gemalto SA, Meudon (FR)

( * ) Notice: Subject to any disclaimer, the term of this patent is extended or adjusted under 35 U.S.C. 154(b) by 0 days.

(21) Appl. No.: 10/498,550

(22) PCT Filed: Dec. 18, 2002

(86) PCT No.: PCT/FR02/04429

§ 371 (c)(1),
(2), (4) Date: Jun. 14, 2004

(87) PCT Pub. No.: WO03/054790

PCT Pub. Date: Jul. 3, 2003

(65) Prior Publication Data

US 2005/0001039 A1    Jan. 6, 2005

(30) Foreign Application Priority Data

Dec. 20, 2001   (FR) .................................. 01 17054

(51) Int. Cl.
*G06K 19/06* (2006.01)
(52) U.S. Cl. ..................... 235/492; 235/487
(58) Field of Classification Search ......... 235/487–489, 235/492; 361/728, 737, 752
See application file for complete search history.

(56) References Cited

U.S. PATENT DOCUMENTS

| | | | | |
|---|---|---|---|---|
| 4,754,319 A * | 6/1988 | Saito et al. | ................... | 257/679 |
| 4,990,759 A * | 2/1991 | Gloton et al. | ................ | 235/492 |
| 5,671,525 A * | 9/1997 | Fidalgo | ........................ | 29/600 |
| 5,681,356 A | 10/1997 | Barak et al. | | |
| 5,852,289 A * | 12/1998 | Masahiko | .................... | 235/492 |
| 5,975,420 A * | 11/1999 | Gogami et al. | .............. | 235/492 |
| 6,065,681 A | 5/2000 | Trueggelmann | | |
| 6,106,317 A * | 8/2000 | Michaelis et al. | ........... | 439/326 |
| 6,193,163 B1 * | 2/2001 | Fehrman et al. | ............. | 235/488 |
| 6,308,894 B1 * | 10/2001 | Hirai et al. | ................... | 235/492 |
| 6,448,638 B1 * | 9/2002 | Fidalgo et al. | ............... | 257/679 |
| 6,568,600 B1 * | 5/2003 | Carpier et al. | .............. | 235/492 |
| 6,607,135 B1 * | 8/2003 | Hirai et al. | ................... | 235/487 |
| 6,634,565 B2 * | 10/2003 | Gray | ........................... | 235/492 |
| 6,651,891 B1 * | 11/2003 | Zakel et al. | .................. | 235/487 |
| 6,719,206 B1 * | 4/2004 | Bashan et al. | ............... | 235/492 |
| 2002/0070280 A1 * | 6/2002 | Ikefuji et al. | ................. | 235/492 |
| 2003/0085288 A1 * | 5/2003 | Luu | ............................. | 235/492 |
| 2005/0023361 A1 * | 2/2005 | Ikefuji et al. | ................. | 235/492 |

FOREIGN PATENT DOCUMENTS

| | | |
|---|---|---|
| DE | 42 18 923 A | 10/1992 |
| DE | 295 03 249 U | 11/1995 |
| FR | 2 783 750 A | 3/2000 |
| FR | 2 794 264 A | 12/2000 |

* cited by examiner

*Primary Examiner*—Kumiko C Koyama
(74) *Attorney, Agent, or Firm*—Buchanan Ingersoll & Rooney PC

(57) ABSTRACT

A smart card includes a card bearing a module that is made up of a support supporting at least an electronic chip. The support is fixed on one surface of the card. This surface extends up to at least one of the edges of the card.

19 Claims, 1 Drawing Sheet

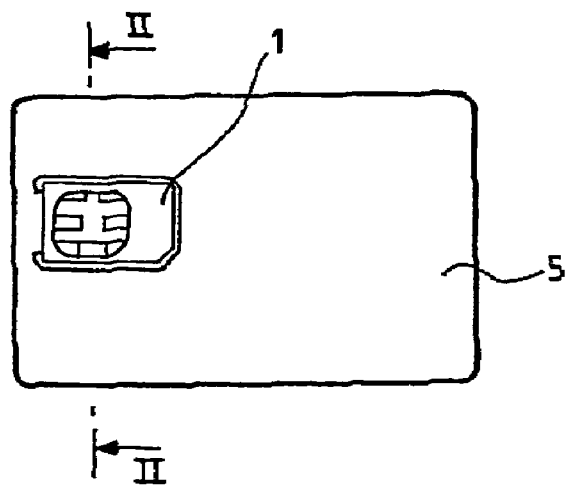
FIG_1
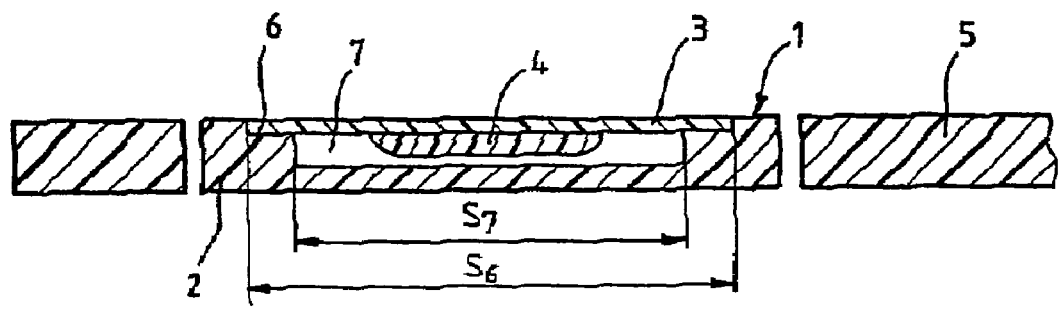
FIG_2
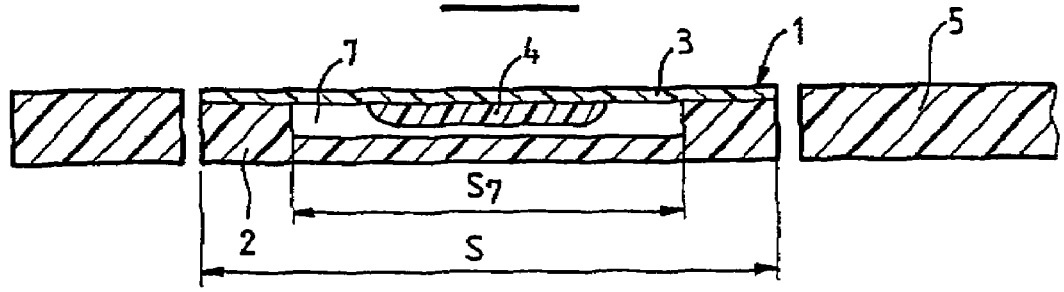
FIG_3

SMART CARD WITH EXTENDED SURFACE MODULE

This disclosure is based upon French Application No. 01/17054, filed Dec. 20, 2001, and International Application No. PCT/FR02/04429, filed on Dec. 18, 2002, the contents of which are incorporated herein by reference.

BACKGROUND OF THE INVENTION

The present invention concerns a smart card and more precisely a smart card comprising a card bearing a module consisting of a support itself supporting at least one electronic chip, said support being fixed on a surface of the card.

A known smart card consists of a card made of plastic material of standardised format, two formats of which are the "bank card" type defined by ISO 7810 and the SIM "mini-card" type for mobile telephony. It bears an electronic module consisting of a support formed from a sheet of dielectric material possibly provided with printed circuits and supporting an electronic chip, for example an electronic memory. As a general rule, this chip is glued on one face of the support and protected by a coat of epoxy resin forming an extra thickness on the support. Hereinafter this face will be referred to as the rear face.

For fixing the module on the card, the latter comprises a first cavity of a first depth and a second cavity of a second depth implemented in the bottom of the first cavity and intended to receive chip and resin. The support is glued in the first cavity around the second cavity. The first cavity has a total surface equal to the surface of the module which is therefore installed by flush fitting therein. The thickness of such a card is standardised and approximately 800 microns, the first depth is approximately 200 microns and the second depth is approximately 400 microns.

What is sought at present is to store a large amount of data on such smart cards and consequently to install larger modules or to install several modules on a single card. This is in order to produce high-capacity memory cards capable of storing directories, music, films, etc.

The arrangement used at present has several problems.

The gluing surface for the module support can prove to be insufficient and lead to poor fixing of said module, in particular in the case of a large-sized chip. This is because this gluing surface is limited to the bottom of the first cavity apart from the second cavity receiving the chip and its protective resin. Consequently, the greater the total surface of the chip or chips, the more insufficient this gluing surface proves to be since the ratio of module surface to gluing surface decreases.

This arrangement also poses manufacturing problems. In view of the depth of the first cavity, approximately 200 microns, this cavity must be implemented at a distance from the edges of the card imposed by the requirements of the moulding process. This distance must also be approximately 200 microns minimum. In fact it is difficult and even impossible to reduce this distance, since it is impossible to inject the plastic material onto a very thin wall. This is a manufacturing requirement running counter to the need to increase the format of the modules, the format of the card being standardised.

SUMMARY OF THE INVENTION

The invention solves these problems and proposes a smart card comprising a card bearing a module consisting of a support itself supporting at least one electronic chip, said support being fixed on a surface of the card, characterised in that the surface extends up to at least one of the edges of the card.

In the case of a module comprising a chip of current standard size (that is approximately 10 mm×8 mm including the drop of protective resin), the solution of the invention makes it possible to increase the gluing surface for the module on the card and therefore increase the reliability of said card. This increase in the gluing surface is obtained by increasing the surface of the support supporting the chip.

And above all, the invention allows reliable fixing of large-sized modules provided with one or more large-sized chips. This is because it is possible to increase the size of the second cavity without reducing the gluing surface for the module on the card.

The invention simplifies the method of manufacturing the card simplifying the step of moulding at the edge of the card in question, by elimination of the thin wall present along the edge of the card.

According to the preferred embodiment, said support extends over the entire surface of the card.

Advantageously, the card comprises a cavity for receiving said support extending up to at least one edge of the card and implemented by moulding or machining.

In addition, the card can comprise at least one cavity for receiving the chip.

Preferably, the smart card is a mini-card.

BRIEF DESCRIPTION OF THE DRAWINGS

The invention is described hereinafter in further detail with the help of figures depicting only one preferred embodiment of the invention.

FIG. 1 is a front view of a detachable SIM (Subscriber Identification Module, for portable telephony) mini-card still attached to a presentation support of "bank card" format according to the prior art.

FIG. 2 is a sectional view along II-II of FIG. 1.

FIG. 3 is an analogous sectional view according to the invention.

DETAILED DESCRIPTION

The following description relates to a SIM mini-card for portable telephony, but the invention applies to any smart card, irrespective of its format and irrespective of its application.

A smart card 1 consists of a card made of plastic material of standardised format 2. It bears an electronic module consisting of a support 3 formed from a sheet of plastic material possibly provided with printed circuits and supporting an electronic chip 4, for example an electronic memory. As a general rule, this chip 4 is glued on a face of the support 3 and protected by a coat of epoxy resin forming an extra thickness on the support.

The figures depict a mini-card 1 attached to a support card of "bank card" format 5 having only a presentation function. In order to use the mini-card 1, it is detached by virtue of cuttable tongues surrounding it.

FIGS. 1 and 2 depict a smart card 1 according to the prior art.

For fixing the module 3, 4 on the card 2, the latter comprises a first cavity 6 of a first depth and a second cavity 7 of a second depth implemented in the bottom of the first cavity 6 and intended to receive chip and resin 4. The support 3 is glued in the first cavity 6 around the second cavity 7. The first cavity 6 has a total surface equal to the surface of the module 3, 4 which is therefore installed by flush fitting therein.

The gluing surface for the module is therefore equal to the surface of the first cavity S6 minus the surface of the second cavity S7.

FIG. 3 is a sectional view analogous to the section of FIG. 2 according to the invention.

Here, the gluing surface for the module 3, 4 is equal to the surface S of the card 2 minus the surface of the cavity S7 intended to receive the chip and the resin 4.

According to the invention, the gluing surface extends up to at least one of the edges of the card 2 and preferably, as depicted, it extends up to all the edges of the card 2. In other words, the support 3 of the glued module extends over the entire surface of the card 2. And in this case, only the cavity 7 is implemented on the card 2 of thickness less than that according to the prior art. This cavity 7 can be implemented by moulding or machining.

The invention therefore makes it possible, with a standardised card size, to increase the gluing surface for the module 3, 4 on the card 2 and therefore increase the reliability of said card.

It also makes it possible essentially to fix, on this card, larger-sized modules provided with larger-sized chips or a greater number of chips. It is self-evident that several cavities 7 can be implemented on the card 2 for receiving several chips.

The invention claimed is:

1. A smart card comprising:
 a layer of card material having a surface defining a plane that extends to the periphery of said card, and a cavity in said surface having a bottom wall that is formed by said layer of card material; and
 an electronic module comprising:
  an electronic chip; and
  a layer of support material having a face onto which said electronic chip is mounted, said face of said support material being adhered to said surface of said card material and extending to at least one edge of said periphery of said card, such that said electronic chip (1) is disposed within said cavity, (2) has a surface coplanar with both the surface of the layer of card material and the face of the support material, and (3) opposes said bottom wall.

2. The smart card of claim 1, wherein said layer of support material extends to each of the peripheral edges of said card, and is thereby coextensive with said card.

3. The smart card of claim 1, wherein said smart card comprises a SIM mini-card that is contained within a larger card from which it can be detached, and whose dimensions are defined by a cutout in said larger card.

4. The smart card of claim 3, wherein said layer of support material extends to said cutout.

5. The smart card of claim 4, wherein said layer of support material terminates at said cutout and does not extend beyond the dimensions of said smart card.

6. A smart card comprising:
 a layer of card material;
 a cutout in said layer of card material that defines a detachable smaller card;
 a first surface on said layer of card material outside of the area defined by said cutout, which extends to the periphery of said smart card;
 a second surface on said layer of card material within the area defined by said cutout, said second surface being recessed relative to said first surface;
 a cavity in said second surface having a bottom wall that is formed by said layer of card material; and
 an electronic module comprising:
  an electronic chip; and
  a layer of support material having a face onto which said electronic chip is mounted, said face of said support material being adhered to said second surface of said card material and extending to at least one edge of the area defined by said cutout, such that said electronic chip is disposed within said cavity and opposes said bottom wall,
 wherein the detachable smaller card comprises the second surface, the cavity, and the electronic module.

7. The smart card of claim 6, wherein said layer of support material extends over the entire area defined by said cutout, and is thereby coextensive with said detachable card.

8. The smart card of claim 7, wherein the surface of said layer of support material on the side opposite from said face is coplanar with said first surface of said layer of card material.

9. The smart card of claim 6, wherein said detachable card comprises a SIM mini-card.

10. The smart card of claim 6, wherein said layer of support material terminates at said cutout and does not extend beyond the dimensions of said detachable card.

11. The smart card of claim 6, wherein the surface of said layer of support material on the side opposite from said face is coplanar with said first surface of said layer of card material.

12. The smart card of claim 11, wherein said layer of support material extends over the entire area defined by said cutout, and is thereby coextensive with said detachable card.

13. The smart card of claim 11, wherein said detachable card comprises a SIM mini-card.

14. The smart card of claim 11, wherein said layer of support material terminates at said cutout and does not extend beyond the dimensions of said detachable card.

15. A smart card comprising:
 a layer of card material having a surface that extends to the periphery of said card, and a cavity in said surface having a bottom wall that is formed by said layer of card material; and
 an electronic module comprising:
  an electronic chip; and
  a layer of support material having a first face onto which said electronic chip is directly mounted, said first face of said support material being adhered to said surface of said card material and extending to at least one edge of said periphery of said card, such that said electronic chip is disposed within said cavity without contacting any portion of the cavity, the electronic chip spaced from and opposing said bottom wall, and a second face of said support material that is opposite said first face forming an exterior surface of said card;
 wherein the electronic chip is the only component disposed in the cavity.

16. The smart card of claim 15, wherein said layer of support material extends to each of the peripheral edges of said card, and is thereby coextensive with said card.

17. The smart card of claim 15, wherein said smart card comprises a SIM mini-card that is contained within a larger card from which it can be detached, and whose dimensions are defined by a cutout in said larger card.

18. The smart card of claim 17, wherein said layer of support material extends to said cutout.

19. The smart card of claim 18, wherein said layer of support material terminates at said cutout and does not extend beyond the dimensions of said smart card.

* * * * *